(12) United States Patent
Kim et al.

(10) Patent No.: US 7,826,296 B2
(45) Date of Patent: Nov. 2, 2010

(54) FUSE MONITORING CIRCUIT FOR SEMICONDUCTOR MEMORY DEVICE

(75) Inventors: Jae-Il Kim, Gyeonggi-do (KR); Jae-Hyuk Im, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 189 days.

(21) Appl. No.: 12/165,135

(22) Filed: Jun. 30, 2008

(65) Prior Publication Data

US 2009/0168580 A1 Jul. 2, 2009

(30) Foreign Application Priority Data

Dec. 27, 2007 (KR) .................. 10-2007-0139139

(51) Int. Cl.
*G11C 17/18* (2006.01)
(52) U.S. Cl. .............. 365/225.7; 365/189.06; 365/189.08
(58) Field of Classification Search .......... 365/225.7, 365/189.06, 189.08, 191, 200, 221
See application file for complete search history.

(56) References Cited

U.S. PATENT DOCUMENTS

| 7,158,435 | B2 * | 1/2007 | Kobayashi et al. ....... 365/225.7 |
| 2009/0168581 | A1 * | 7/2009 | Im et al. .................. 365/225.7 |

FOREIGN PATENT DOCUMENTS

| KR | 91-001533 | 3/1991 |
| KR | 1020020040116 A | 5/2002 |
| KR | 1020050102305 A | 10/2005 |
| KR | 1020090070862 A | 7/2009 |

OTHER PUBLICATIONS

Notice of Allowance issued from Korean Intellectual Property Office on Sep. 1, 2009 with an English Translation.
Notice of Preliminary Rejection issued from Korean Intellectual Property Office on Apr. 24, 2009 with an English Translation.

* cited by examiner

*Primary Examiner*—Richard Elms
*Assistant Examiner*—Hien N Nguyen
(74) *Attorney, Agent, or Firm*—IP & T Group LLP

(57) ABSTRACT

A fuse monitoring circuit for a semiconductor device includes a repair fuse unit including a number of fuses to which a repair address is programmed, and configured to output fuse state signals corresponding to the connection states of the respective fuses in response to a fuse initialization signal. A serial fuse monitoring unit is configured to output a fuse state monitoring signal corresponding to each fuse state signal selected by an applied address in response to a serial monitoring test mode signal. Also, a parallel fuse monitoring unit is configured to output a repair monitoring signal by comparing an applied address and the repair address in response to a parallel monitoring test mode signal. An output unit is configured to output the fuse state monitoring signal and the repair monitoring signal to an output pad in response to an output control signal.

17 Claims, 8 Drawing Sheets

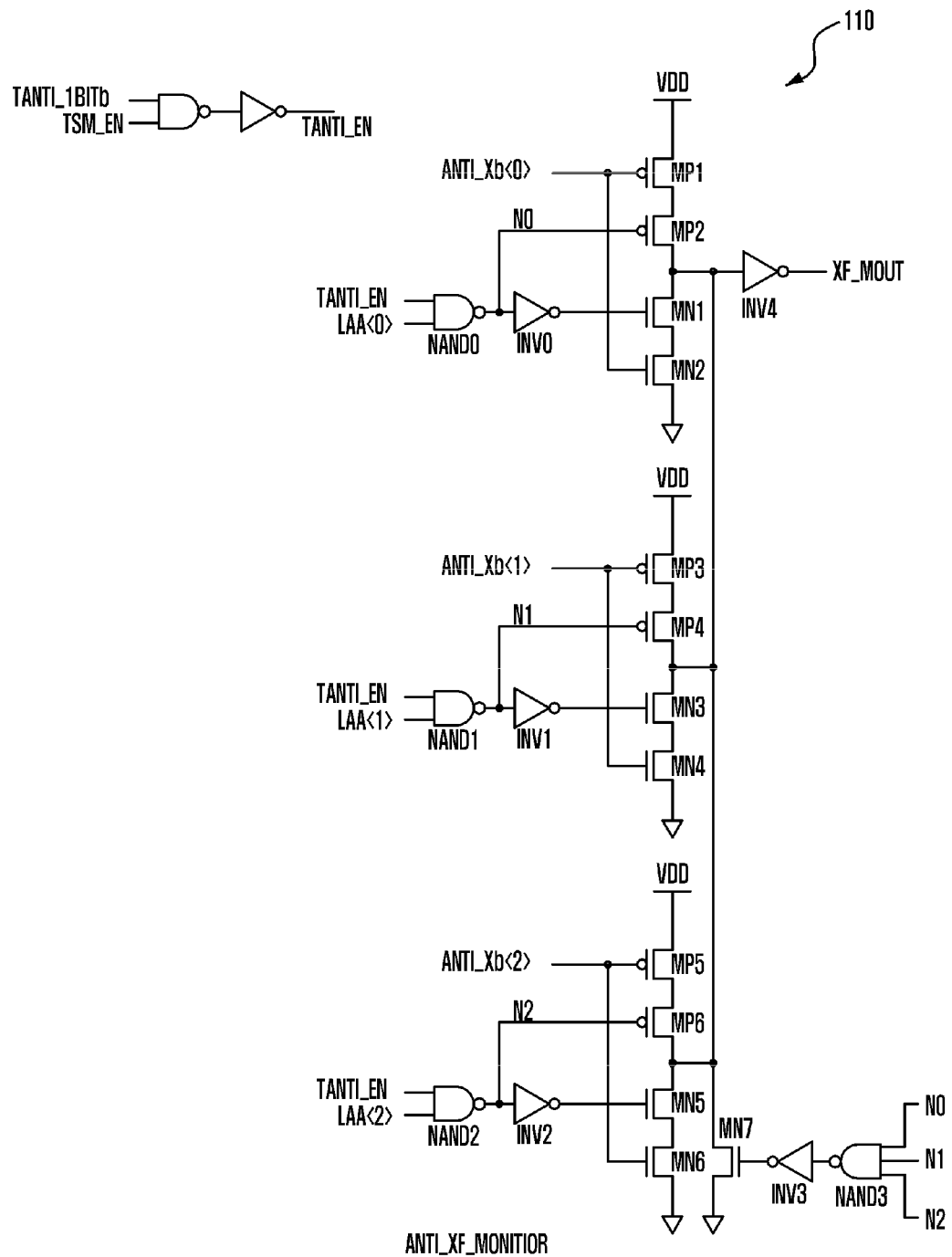

FUSE MONITORING CIRCUIT FOR SEMICONDUCTOR MEMORY DEVICE

CROSS-REFERENCE TO RELATED APPLICATIONS

The present invention claims priority of Korean patent application number 10-2007-0139139, filed on Dec. 27, 2007, which is incorporated by reference in its entirety.

BACKGROUND OF THE INVENTION

The present invention relates to semiconductor design technology, and more particularly, to technology for monitoring a fuse of a redundancy circuit among the internal circuits of a semiconductor memory device.

With the development of the high integration technology for semiconductor memory devices, the number of signal lines and memory cells included in one semiconductor memory device is increasing rapidly, and the linewidth of an internal circuit and the size of a memory cell are decreasing gradually due to a limited integration space, which increases the possibility of a defect in a memory cell of a semiconductor memory device. In spite of cell defects, semiconductor memory devices with a desired capacity can be produced with a high yield because a semiconductor memory device includes a redundancy circuit for repairing defective memory cells. The redundancy circuit includes redundancy memory cells and fuses for programming repair addresses corresponding to defective memory cells. Various tests are performed upon completion of a wafer process. A memory cell, which is determined to be defective but reparable, is replaced with a redundancy memory cell. That is, a programming operation is performed in an internal circuit to replace an address corresponding to a defective memory cell with an address of a redundancy memory cell. Thus, when the address corresponding to the defective memory cell is input, the defective memory cell is replaced with the redundancy memory cell, so that the memory device can perform a normal operation. A fuse programming method is used to program address information corresponding to a defective memory cell. A typical example of the fuse programming method is a laser blowing type (generally called 'physical fuse type') programming method that blows out a connected fuse using a laser beam. However, the physical fuse programming method using a laser beam is possible only in a wafer state before a semiconductor memory device is fabricated in a package. Thus, instead of the physical programming method, an electrical programming method is used to replace a defective memory cell with a redundancy memory cell in a package state. A fuse programmable in a package state is called an electrical fuse. An electrical fuse can be programmed by electrically changing the connection state of the electrical fuse. The electrical fuse can be subdivided into an anti-type fuse and a blowing-type fuse. When a programming operation is performed, the anti-type fuse changes from an open state to a short state whereas the blowing-type fuse changes from a short state to an open state. The electrical fuse is very high in terms of the efficiency in a package state because it aims at programming after a packaging process.

A physical fuse is programmed in a wafer state, whereas an electrical fuse is programmed in a package state. Therefore, the connection state of the programmed electrical fuse is difficult to monitor with the naked eye. In the related art, a package must be removed in order to monitor the connection state of an electrically programmed fuse. However, removing the package for a test process reduces the value of a finished product and the test efficiency.

SUMMARY OF THE INVENTION

Embodiments of the present invention are directed to providing a fuse monitoring circuit that makes it possible to monitor the programming state and the connection state of a programmed fuse from the outside of a semiconductor memory device.

In accordance with an aspect of the invention, there is provided a repair fuse unit comprising a plurality of fuses to which a repair address is programmed, and configured to output a plurality of fuse state signals corresponding to the connection states of the respective fuses in response to a fuse initialization signal, a serial fuse monitoring unit configured to output a fuse state monitoring signal corresponding to each fuse state signal selected by an applied address in response to a serial monitoring test mode signal, a parallel fuse monitoring unit configured to output a repair monitoring signal by comparing an applied address and the repair address in response to a parallel monitoring test mode signal and an output unit configured to output the fuse state monitoring signal and the repair monitoring signal to an output pad in response to an output control signal.

BRIEF DESCRIPTION OF THE DRAWINGS

FIG. 3A is a circuit diagram of a serial row fuse monitoring unit ANTI_XF_MONITOR illustrated in FIG. 2, in accordance with an embodiment of the invention.

DESCRIPTION OF SPECIFIC EMBODIMENTS

Hereinafter, a fuse monitoring circuit for a semiconductor memory device in accordance with the present invention will be described in detail with reference to the accompanying drawings.

The advantages, features and aspects of the invention will become apparent from the following description of the embodiments of the invention with reference to the accompanying drawings, which is set forth hereinafter. Therefore, the technological concept of the prevention invention can be easily embodied by those skilled in the art to which the invention pertains.

The following description will be given of an exemplary embodiment of repairing a 1-bit defective memory cell.

Figure 1:
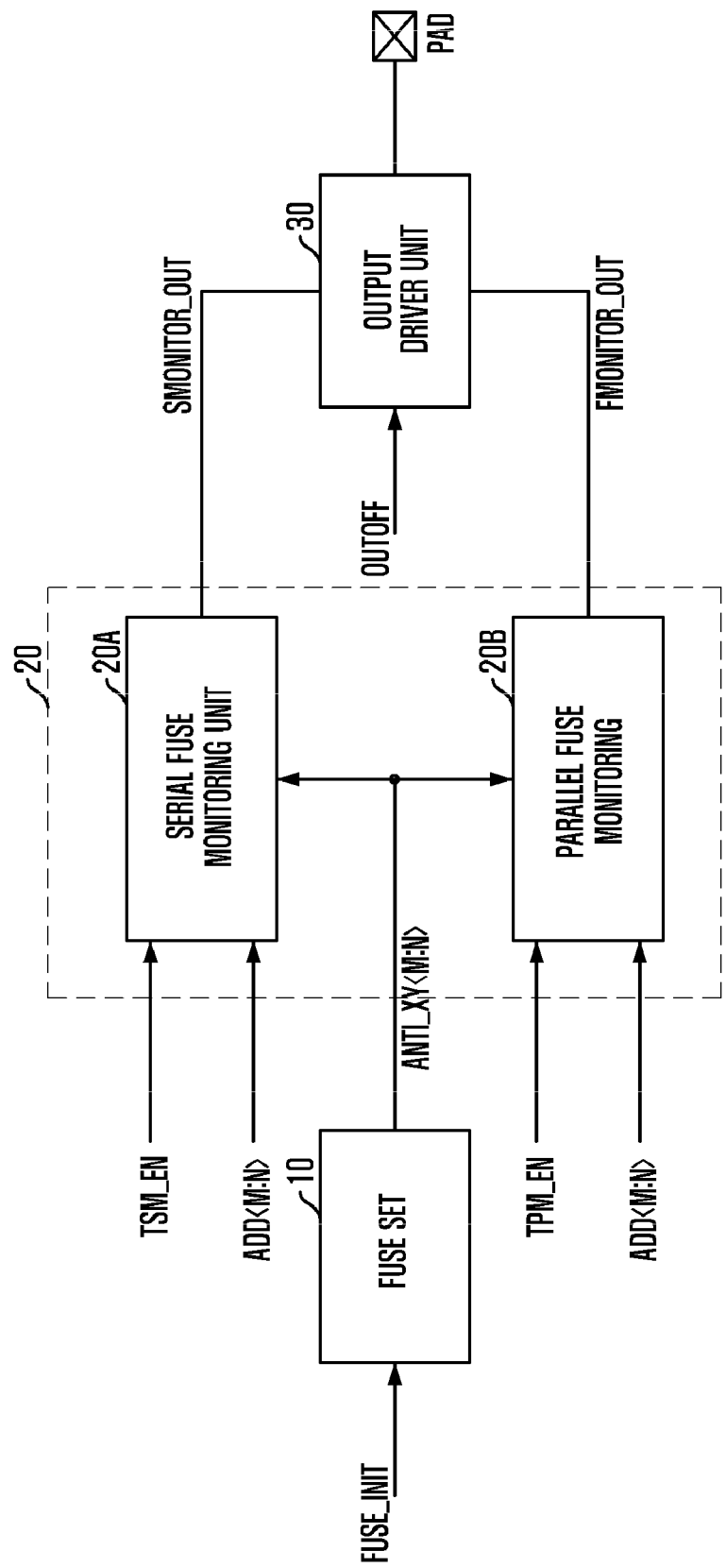
FIG. 1 is a block diagram of a fuse monitoring circuit in accordance with an embodiment of the present invention.

FIG. 1 is a block diagram of a fuse monitoring circuit in accordance with an embodiment of the invention.

Referring to FIG. 1, a fuse monitoring circuit in accordance with an embodiment of the invention includes a fuse set 10, a fuse monitoring unit 20, and an output driver unit 30. The fuse monitoring unit 20 includes a serial fuse monitoring unit 20a and a parallel fuse monitoring unit 20b. The fuse set 10 includes a plurality of fuses to which a repair address is programmed. The fuse set 10 is configured to output a plurality of fuse state signals ANTI_XY<M:N> corresponding to the connection states of the respective fuses in response to a fuse initialization signal FUSE_INIT. The serial fuse monitoring unit 20a is configured to output a fuse state monitoring signal SMONITOR_OUT corresponding to each fuse state signal ANTI_XY<k> selected by an applied address ADD<M:N> in response to a serial monitoring test mode signal TSM_EN. The parallel fuse monitoring unit 20b is configured to output a repair monitoring signal FMONITOR_OUT by comparing the applied address ADD<M:N> and a repair address ANTI_XY<M:N> in response to a parallel monitoring test mode signal TPM_EN. The output driver unit 30 is configured to output the fuse state monitoring signal SMONITOR_OUT and the repair monitoring signal FMONITOR_OUT to an output pad in response to an output control signal OUTOFF.

The fuse set 10 includes a plurality of fuses, to which a repair address designating a defective memory cell is programmed. In response to the fuse initialization signal FUSE_INIT, the fuse set 10 outputs the fuse state signal ANTI_X(Y)<M:N> indicating the rupture of fuses that are used to program the repair address.

In general, a bank address, a row address, and a column address are needed to designate one memory cell in a dynamic random access memory (DRAM). Therefore, all of a bank address, a row address, and a column address had to be programmed in order to repair one defective memory cell. The following description will be made on the assumption that a bank address, a row address, and a column address were all programmed to the fuse set 10 and an electrical anti-type fuse (hereinafter referred to as an 'anti-fuse') was used.

The parallel fuse monitoring unit 20b is used to monitor whether the repair address of the fuse set 10 was accurately programmed, and the serial fuse monitoring unit 20a is used to monitor whether each fuse was ruptured. The output driver unit 30 outputs the monitoring results to the output pad PAD so that the monitoring results can be monitored from the outside through the output pad PAD. 'Monitoring the fuse to which the repair address was programmed' is equivalent to 'monitoring the repair address', and thus the latter phrase will hereinafter be used interchangeably with the former phrase.

Figure 2:
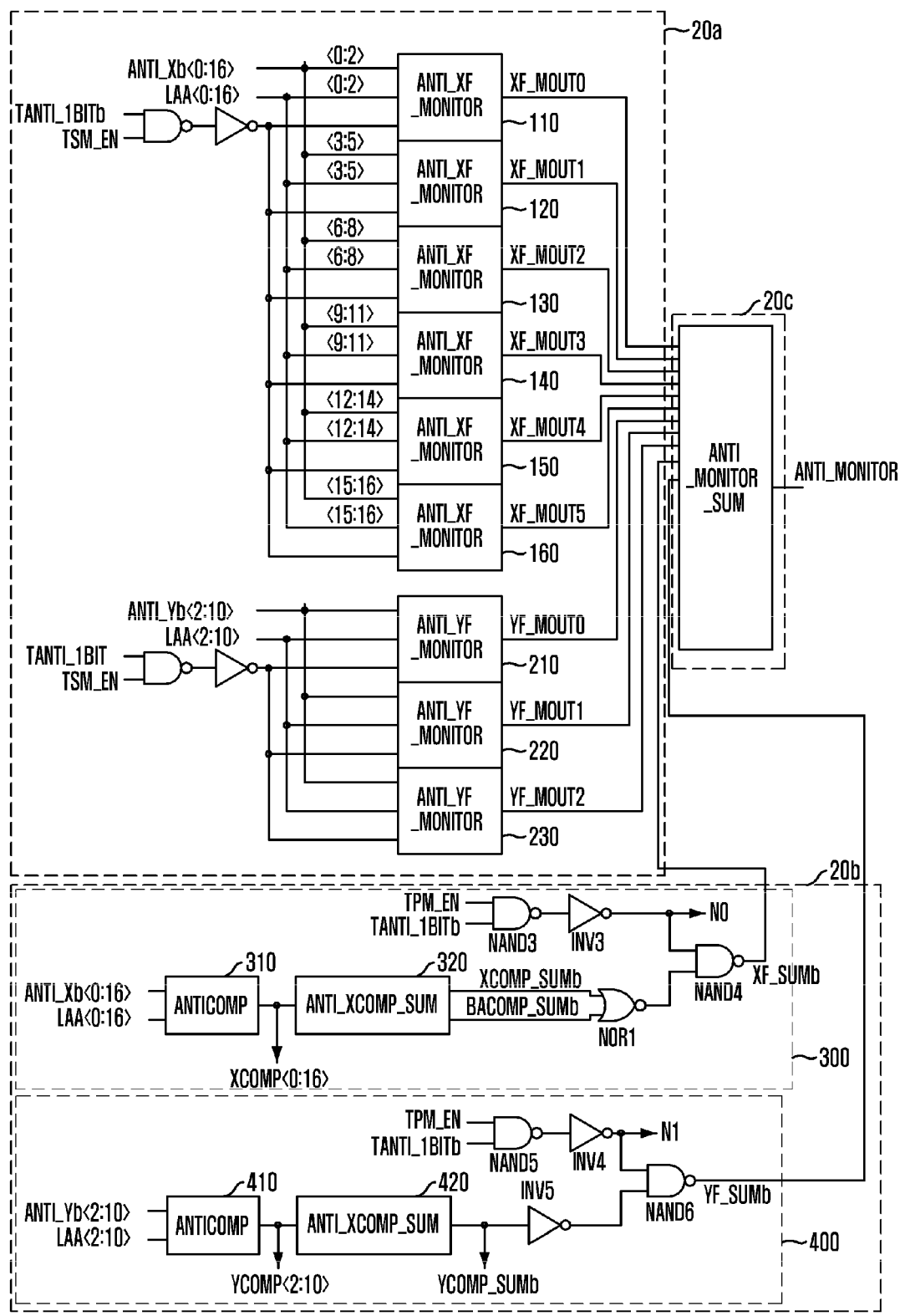
FIG. 2 is a circuit diagram of a fuse monitoring unit illustrated in FIG. 1, in accordance with an embodiment of the invention.

FIG. 2 is a circuit diagram of the fuse monitoring unit 20 illustrated in FIG. 1, in accordance with an embodiment of the invention.

Referring to FIG. 2, a fuse monitoring unit 20 in accordance with an embodiment of the invention includes a serial fuse monitoring unit 20a, a parallel fuse monitoring unit 20b, and a fuse monitoring signal generator unit 20c.

The serial fuse monitoring unit 20a includes a plurality of serial row fuse monitoring units 110 to 160 and a plurality of serial column fuse monitoring units 210 to 230. The serial row fuse monitoring units 110 to 160 are configured to output a plurality of row fuse state monitoring signals XF_MOUT0 to XF_MOUT5 corresponding to each row fuse state signal and each address bit signal of an applied row address LAA<0:16> in response to a serial monitoring test mode signal TSM_EN and row/column selection signals TANTI_1BIT and TANTI_1BITb. The serial column fuse monitoring units 210 to 230 are configured to output a plurality of column fuse state monitoring signals YF_MOUT0 to YF_MOUT2 corresponding to each column fuse state signal and each address bit signal of an applied column address ADD<2:10> in response to the serial monitoring test mode signal TSM_EN and the row/column selection signals TANTI_1BIT and TANTI_1BITb.

The parallel fuse monitoring unit 20b includes a parallel row fuse monitoring unit 300 and a parallel column fuse monitoring unit 400. The parallel row fuse monitoring unit 300 is configured to output a row repair monitoring signal XF_SUMb by comparing the applied row address LAA<0:16> and a row repair address ANTI_Xb<0:16> in response to a parallel monitoring test mode signal TPM_EN and the row/column selection signals TANTI_1BIT and TANTI_1BITb. The parallel column fuse monitoring unit 400 is configured to output a column repair monitoring signal YF_SUMb by comparing the applied column address LAA<2:10> and a column repair address ANTI_Yb<0:16> in response to the parallel monitoring test mode signal TPM_EN and the row/column selection signals TANTI_1BIT and TANTI_1BITb.

The fuse monitoring unit 20 operates as follows. A fuse monitoring operation mode is divided into the following four operation modes, depending on the serial monitoring test mode signal TSM_EN, the parallel monitoring test mode signal TPM_EN, and the row/column selection signals TANTI_1BIT and TANTI_1BITb.

A first operation mode (a serial row fuse monitoring mode): (TANTI_1BIT, TSMEN)=(0, 1)

A second operation mode (a serial column fuse monitoring mode): (TANTI_1BIT, TSMEN)=(1, 1)

A third operation mode (a parallel row fuse monitoring mode): (TANTI_1BIT, TPMEN)=(0, 1)

A fourth operation mode (a parallel column fuse monitoring mode): (TANTI_1BIT, TPMEN)=(1, 1)

The serial monitoring test mode signal TSM_EN and the parallel monitoring test mode signal TPM_EN are used to determine a serial fuse monitoring mode or a parallel fuse monitoring mode, and the row/column selection signals TANTI_1BIT and TANTI_1BITb are used to select a row repair address or a column repair address in the respective monitoring modes. Herein, the row repair address includes a band repair address and the column repair address includes a repair monitoring fuse address.

The row address LAA<0:16> indicates a signal that is obtained by latching an address signal, which is applied to an address pin, at a rising edge of a clock signal. The row address LAA<0:16> includes a bank address LAA<14:16>, and the column address LAA<2:10> includes a repair monitoring fuse address LAA<10>.

A row fuse state signal ANTI_Xb<0:16> and a column fuse state signal ANTI_Yb<2:10> are output from the fuse set 10, and indicate the programmed repair address and the fuse rupture information. If a fuse was ruptured, the fuse set 10 outputs a digital value '1'. On the other hand, if the fuse was not ruptured, the fuse set 10 outputs a digital value '0'.

The constructions and operations of the serial row fuse monitoring units 110 to 160 and the serial column fuse monitoring units 210 to 230 will now be described for description of the first operation mode and the second operation mode.

Figure 3B:
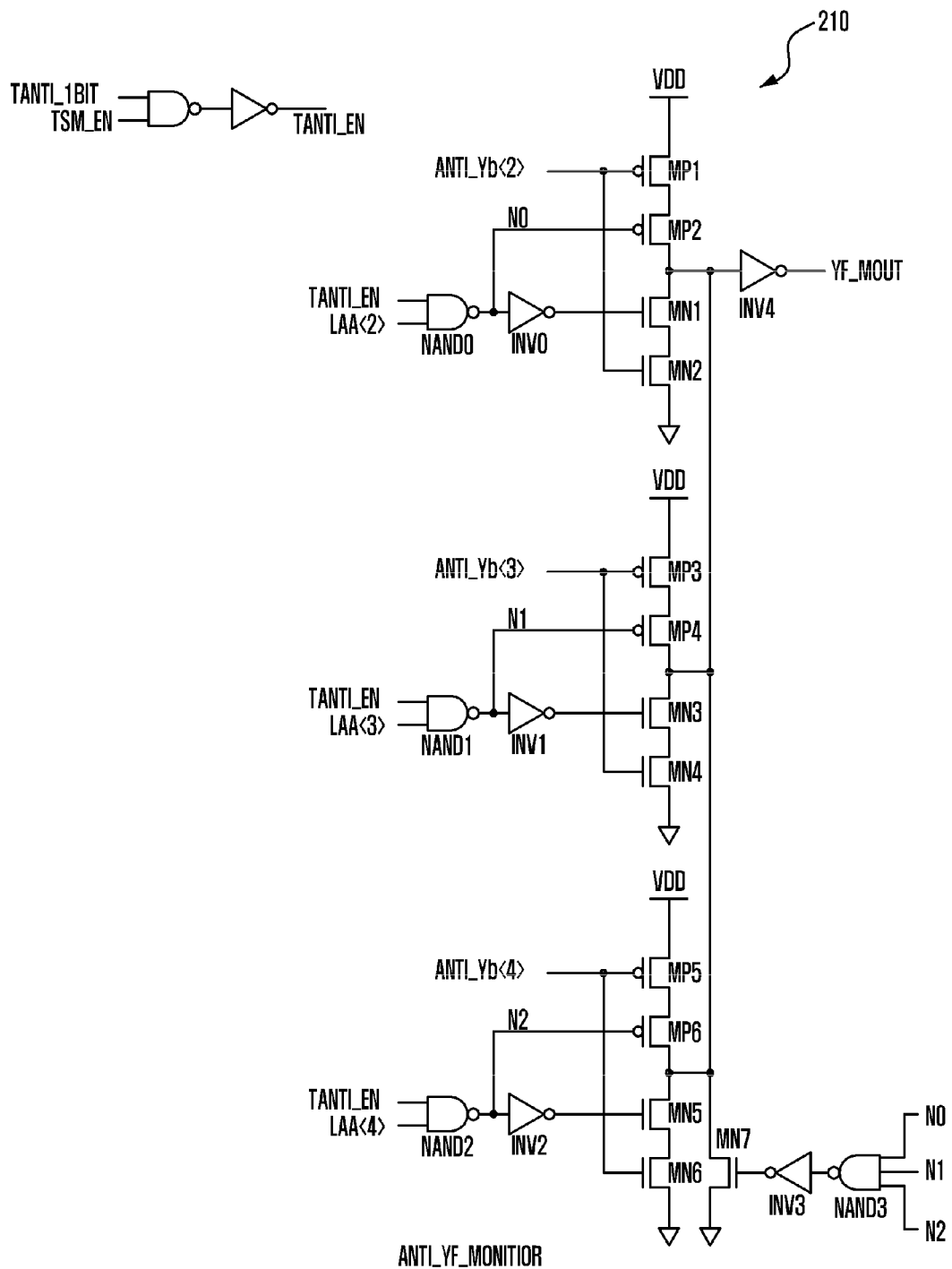
FIG. 3B is a circuit diagram of a serial column fuse monitoring unit ANTI_YF_MONITOR illustrated in FIG. 2, in accordance with an embodiment of the invention.

FIG. 3A is a circuit diagram of a serial row fuse monitoring unit ANTI_XF_MONITOR illustrated in FIG. 2, in accordance with an embodiment of the invention FIG. 3B is a circuit diagram of a serial column fuse monitoring unit ANTI_YF_MONITOR illustrated in FIG. 2, in accordance with an embodiment of the invention.

The construction and operation of the serial row fuse monitoring unit are identical to those of the serial column fuse monitoring unit with the exception that an input address of the serial row fuse monitoring unit is a row address whereas an input address of the serial column fuse monitoring unit is a column address. Each of these circuits includes NAND gates NAND0-NAND3, inverters INV0-INV4, and transistors MN1-MN7 and MP1-MP6.

The operation of the serial row fuse monitoring unit ANTI_XF_MONITOR in the first operation mode (i.e., the serial row fuse monitoring mode) will now be described with reference to FIGS. 2 and 3A.

Referring to FIGS. 2 and 3A, since (TANTI_1BIT, TSEN)=(0, 1), an enable signal TANTI_EN of the serial row fuse monitoring unit becomes '1'. At this point, the outputs YF_MOUT0 to YF_MOUT2 of the serial column fuse monitoring units 210 to 230 (except the serial row fuse monitoring units 110 to 160), the output XF_SUMb of the parallel row fuse monitoring unit, and the output YF_SUMb of the parallel column fuse monitoring unit all have an initial value of '1'.

First, when a row address LAA<0:2> applied to the serial row fuse monitoring unit of FIG. 3A is '000', the values of all nodes N0, N1 and N2 become '1' and a row fuse state monitoring signal XF_MOUT (i.e., the output signal) becomes '1' regardless of a row fuse state signal ANTI_Xb<0:2>.

Second, when the applied row address LAA<0:2> is input with only one bit selected like '100', '010' and '001', only the node value corresponding to the selected bit becomes '0' and the other node values become '1'. At this point, the row fuse state monitoring signal XF_MOUT (i.e., the output signal) is determined according to the row fuse state signal ANTI_Xb with an input node value of '0'. Herein, the row fuse state monitoring signal XF_MOUT becomes '1' if the corresponding row fuse state signal ANTI_Xb is '1'; and the row fuse state monitoring signal XF_MOUT becomes '0' if the corresponding row fuse state signal ANTI_Xb is '0'. That is, the value of the row fuse state signal ANTI_Xb with an input node value of '0' is transferred as the row fuse state monitoring signal XF_MOUT (i.e., the output signal).

The above first and second operations can be expansively applied to the serial row fuse monitoring units 110 to 160 of FIG. 2. When applied row addresses LAA<0:16> are all '0', row fuse state monitoring signals XF_MOUT0 to XF_MOUT5 become '1' regardless of row fuse state signals ANTI_Xb<0:16>. That is, the applied row addresses LAA<0:16> are all '0', the serial row fuse monitoring units 110 to 160 are initialized. Next, when the applied row addresses LAA<0:16> are input with only one bit selected as '1', only the value of the corresponding node in the serial row fuse monitoring unit ANTI_XF_MONITOR into which an address of the selected bit is input becomes '0' and the values of the other nodes all become '1'. Thus, the row fuse state monitoring signal XF_MOUT is determined according to the value of the row fuse state signal ANTI_Xb with an input node value of '0', and the row fuse state monitoring signals XF_MOUT for the other serial row fuse monitoring units ANTI_XF_MONITOR with all input row addresses of '0' are all fixed to '1' regardless of the applied row fuse state signal ANTI_Xb.

Thus, the row fuse state signal ANTI_Xb selected by the row address LAA<0:16> can be detected through the row fuse state monitoring signal XF_MOUT0 to XF_MOUT5. In the first operation mode, since the outputs YF_MOUT0 to YF_MOUT2 of the serial column fuse monitoring units, the output XF_SUMb of the parallel row fuse monitoring unit, and the output YF_SUMb of the parallel column fuse monitoring unit all have an initial value of '1', all the outputs of the fuse monitoring signal generator unit 20c are summed to generate a fuse monitoring signal ANTI_MONITOR that is to be transferred to the output driver unit 30. The fuse monitoring signal ANTI_MONITOR in the first operation mode indicates the row fuse state signal ANTI_Xb selected by the row address LAA<0:16>, that is, whether the selected row fuse is ruptured.

The operation of the serial column fuse monitoring unit ANTI_YF_MONITOR in the second operation mode (i.e., the serial column fuse monitoring mode) will now be described with reference to FIGS. 2 and 3B.

Referring to FIGS. 2 and 3B, since (TANTI_1BIT, TSEN)=(1, 1), an enable signal TANTI_EN of the serial column fuse monitoring unit ANTI_YF_MONITOR becomes '1'. At this point, the outputs XF_MOUT0 to XF_MOUT5 of the serial row fuse monitoring units 110 to 160 (except the serial column fuse monitoring units 210 to 230), the output XF_SUMb of the parallel row fuse monitoring unit, and the output YF_SUMb of the parallel column fuse monitoring unit all have an initial value of '1'.

First, when a column address LAA<2:4> applied to the serial column fuse monitoring unit ANTI_YF_MONITOR of FIG. 3B is '000', the values of all nodes N0, N1 and N2 become '1' and a column fuse state monitoring signal YF_MOUT (i.e., the output signal) becomes '1' regardless of a column fuse state signal ANTI_Yb<2:4>.

Second, when the applied column address LAA<2:4> is input with only one bit selected like '100', '010' and '001', only the node value corresponding to the selected bit becomes '0' and the other node values become '1'. At this point, the column fuse state monitoring signal YF_MOUT (i.e., the output signal) is determined according to the column fuse state signal ANTI_Yb with an input node value of '0'. Herein, the column fuse state monitoring signal YF_MOUT becomes '1' if the corresponding column fuse state signal ANTI_Yb is '1'; and the column fuse state monitoring signal YF_MOUT becomes '0' if the corresponding column fuse state signal ANTI_Yb is '0'. That is, the value of the column fuse state signal ANTI_Yb with an input node value of '0' is transferred as the column fuse state monitoring signal YF_MOUT (i.e., the output signal).

The above first and second operations can be expansively applied to the serial column fuse monitoring units 210 to 230 of FIG. 2. When applied column addresses LAA<2:10> are all '0', column fuse state monitoring signals YF_MOUT0 to YF_MOUT2 become '1' regardless of column fuse state signals ANTI_Yb<2:10>. That is, the applied column addresses LAA<2:10> are all '0', the serial column fuse monitoring units 210 to 230 are initialized. Next, when the applied column addresses LAA<2:10> are input with only one bit selected as '1', only the value of the corresponding node in the serial column fuse monitoring unit ANTI_YF_MONITOR into which an address of the selected bit is input becomes '0' and the values of the other nodes all become '1'. Thus, the column fuse state monitoring signal YF_MOUT is determined according to the value of the column fuse state signal ANTI_Yb with an input node value of '0', and the column fuse state monitoring signals YF_MOUT for the other serial column fuse monitoring units ANTI_YF_MONITOR with all input column addresses of '0' are all fixed to '1' regardless of the applied column fuse state signal ANTI_Yb.

Thus, the column fuse state signal ANTI_Yb selected by the column address LAA<2:10> can be detected through the column fuse state monitoring signal YF_MOUT0 to YF_MOUT2 (i.e., the output signals). In the second operation mode, since the outputs XF_MOUT0 to xF_MOUT5 of the serial row fuse monitoring units, the output XF_SUMb of the parallel row fuse monitoring unit, and the output YF_SUMb of the parallel column fuse monitoring unit all have an initial value of '1', all the outputs of the fuse monitoring signal generator unit 20c are summed to generate a fuse monitoring signal ANTI_MONITOR that is to be transferred to the output driver unit 30. The fuse monitoring signal ANTI_MONITOR in the second operation mode indicates the column fuse state signal ANTI_Yb selected by the column address LAA<2:10>, that is, whether the selected column fuse is ruptured.

The constructions and operations of the parallel row fuse monitoring unit 300 and the parallel column fuse monitoring unit 400 will now be described for description of the third operation mode and the fourth operation mode.

Figure 4:
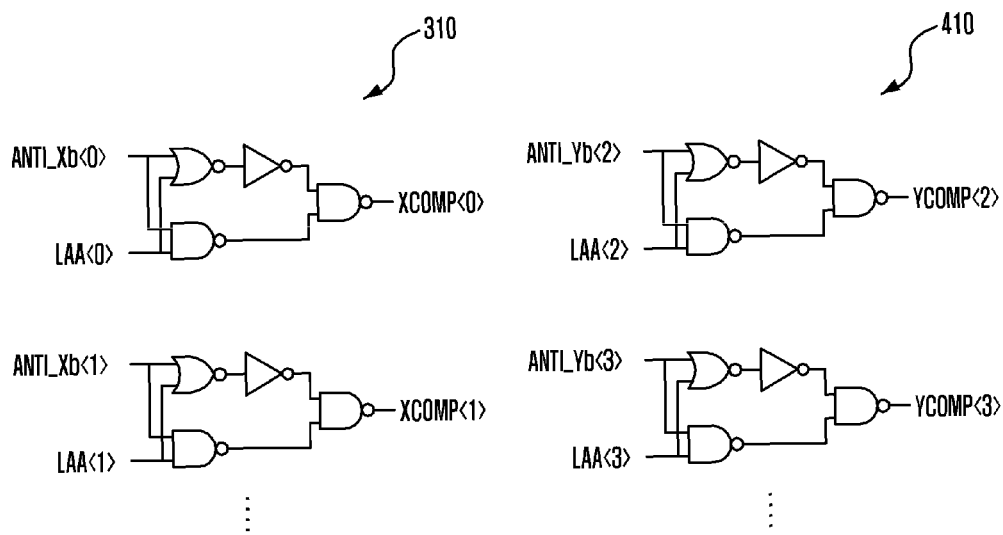
FIG. 4 is a circuit diagram of comparing blocks ANTI_COMP of a parallel fuse monitoring unit illustrated in FIG. 2, in accordance with an embodiment of the invention.

FIG. 4 is a circuit diagram of comparing blocks 310 and 410 of the parallel fuse monitoring unit 20b illustrated in FIG. 2, in accordance with an embodiment of the invention.

Referring to FIG. 4, each of the comparing blocks 310 and 410 XNOR-operates each bit of a fuse state signal and an input address bit signal to output the result. Each of the comparing block 310 of the parallel row fuse monitoring unit 300 and the comparing block 410 of the parallel column fuse monitoring unit 400 compares an input address ADD and a fuse state signal ANTI_X(Y)b on a bit-by-bit basis to output the result. Therefore, an output signal X(Y)COMP<0> becomes '1' if an input address ADD<0> and a fuse state signal ADD<0> have the same value; and the output signal X(Y)COMP<0> becomes '1' if the input address ADD<0> and the fuse state signal ADD<0> have different values.

Figure 5A:
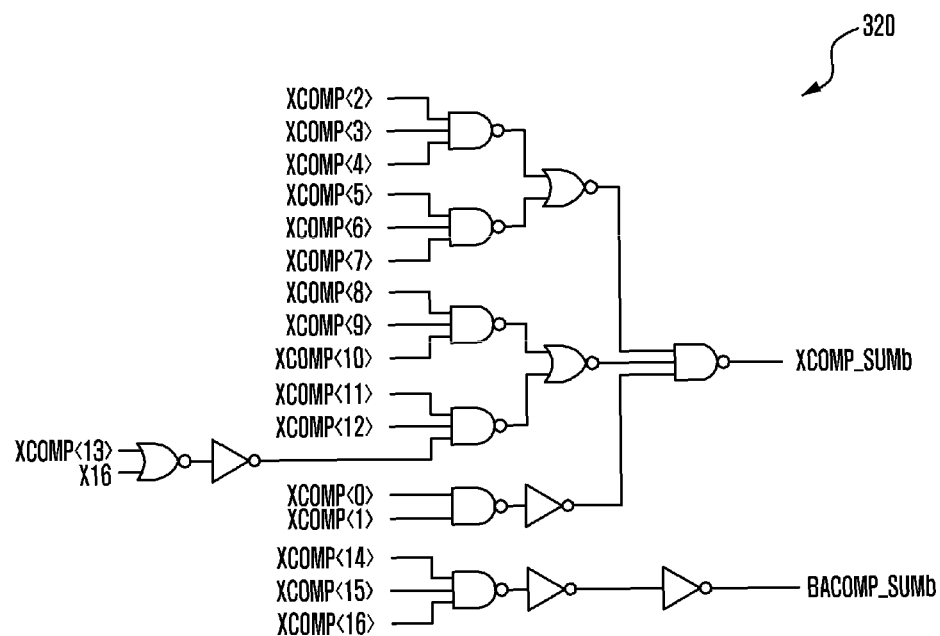
FIG. 5A is a circuit diagram of a row summing block ANTI_XCOMP_SUM of the parallel fuse monitoring unit illustrated in FIG. 2, in accordance with an embodiment of the invention.

FIG. 5A is a circuit diagram of a row summing block ANTI_XCOMP_SUM of the parallel fuse monitoring unit 20b illustrated in FIG. 2, in accordance with an embodiment of the invention.

Referring to FIG. 5A, a row summing block 320 NAND-operates a row address portion and a band address portion of an input signal XCOMP<0:16> to output the result. Therefore, the row summing block 320 outputs the corresponding output signals XCOMP_SUMb and BACOMP_SUMb as '0' if input signals XCOMP<0:16> are all '1'; and the row summing block 320 outputs the corresponding output signals XCOMP_SUMb and BACOMP_SUMb as '1' if the input signals XCOMP<0:16> are not all '1'. The row summing block 320 is provided with an additional circuit to control the output of a signal XCOMP<13> using an output word selection signal X16. The reason for this is that the number of necessary row address bits differs depending on the unit of a word output from the data output pad.

The operation of the parallel row fuse monitoring unit 300 in the third operation mode (i.e., the parallel row fuse monitoring mode) will now be described with reference to FIGS. 2, 4 and 5A.

Referring to FIGS. 2, 4 and 5A, since (TANTI_1BIT, TPMEN)=(0, 1), the value of a node N0 of the parallel row fuse monitoring unit 300 becomes 1. Therefore, an output signal XF_SUMb of the parallel row fuse monitoring unit 300 is determined by the output signals XCOMP_SUMb and BACOMP_SUMb of the row summing block 320. At this point, since the value of a node N1 of the parallel column fuse monitoring unit 400 becomes '0', an output signal YF_SUMb of the parallel column fuse monitoring unit 400 becomes '1' regardless of an output signal YCOMP_SUMb of a column summing block 420. That is, the output YF_SUMb of the parallel column fuse monitoring unit 400 (except the output XF_SUMb of the parallel row fuse monitoring unit 300), the outputs XF_MOUT0 to XF_MOUT5 of the serial row fuse monitoring unit 110 to 160, and the outputs YF_MOUT0 to YF_MOUT2 of the serial column fuse monitoring units 210 to 230 all have an initial value of '1'.

First, when a row fuse state signal ANTI_Xb<0:16> and a row address LAA<0:16> input into the comparing block 310 of the parallel row fuse monitoring unit 300 are identical to each other, all the bits of an output signal XCOMP<0:16> become '1'.

Since all the bits of the output signal XCOMP<0:16> of the comparing block 310, which is applied to the row summing block 320, are '1', the output signals XCOMP_SUMb and BACOMP_SUMb of the row summing block 320 become '0' and the output XF_SUMb of the parallel row fuse monitoring unit 300 becomes '0' through a NOR gate NOR1 and a NAND gate NAND4. This indicates that the row repair address and the band repair address were normally programmed.

Second, when the row fuse state signal ANTI_Xb<0:16> and the row address LAA<0:16> input into the comparing block 310 of the parallel row fuse monitoring unit 300 are different from each other, the output signal XCOMP<0:16> is output as '1' on a bit-by-bit basis if the results of the XNOR operation of the two signals are identical to each other. On the other hand, if the results of the XNOR operation of the two signals are different from each other, the output signal XCOMP<0:16> is output as '0' on a bit-by-bit basis. For example, if the inputs are LAA<0:16>='1111 1111 1111 0000 0' and ANTI_Xb<0:16>='1001 1111 1111 0000", the output value is XCOMP<0:16>='1001 1111 1111 1111 1'. That is, XCOMP<1> and XCOMP<2> become '0' and the other bits all become '1'.

The two output signals XCOMP_SUMb and BACOMP_SUMb generated by the row summing block 320 are output as '0' only when the corresponding input signals are all '1'. Therefore, in the above example, the output signal XCOMP_SUMb becomes '1', the output signal BACOMP_SUMb becomes '0', and the output XF_SUMb of the parallel row fuse monitoring unit 300 becomes '1' through the NOR gate NOR1 and the NAND gate NAND4. This indicates that that the row repair address or the band repair address was not normally programmed.

In the above first and second operations, since the output YF_SUMb of the parallel column fuse monitoring unit 400, the outputs XF_MOUT0 to XF_MOUT5 of the serial row fuse monitoring units 110 to 160, and the outputs YF_MOUT0 to YF_MOUT2 of the serial column fuse monitoring units 210 to 230 all have an initial value of '1', all the outputs of the fuse monitoring signal generator unit 20c are summed to generate a fuse monitoring signal ANTI_MONITOR that is to be transferred to the output driver unit 30. That is, the fuse monitoring signal ANTI_MONITOR in the third operation mode indicates whether the row repair address ANTI_Xb<0:16> was normally programmed.

Figure 5B:
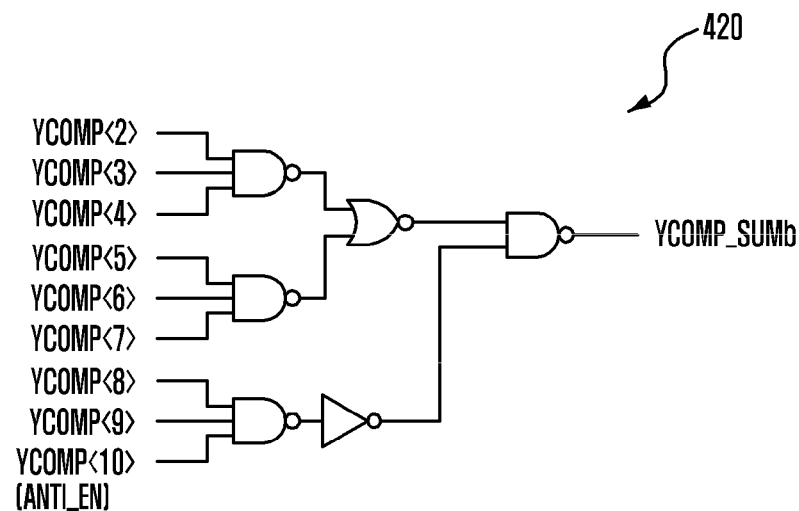
FIG. 5B is a circuit diagram of a column summing block ANTI_YCOMP_SUM of the parallel fuse monitoring unit illustrated in FIG. 2, in accordance with an embodiment of the invention.

FIG. 5B is a circuit diagram of a column summing block ANTI_YCOMP_SUM of the parallel fuse monitoring unit 20b illustrated in FIG. 2, in accordance with an embodiment of the invention.

The operation of the parallel column fuse monitoring unit 400 in the fourth operation mode (i.e., the parallel column fuse monitoring mode) will now be described with reference to FIGS. 2, 4 and 5B.

Referring to FIG. 5B, a column summing block 420 NAND-operates all input signals YCOMP<2:10> to output the NAND operation result YCOMP_SUMb. In the column summing block 420, a signal COMP<10> corresponds to a repair monitoring fuse address ANTI_EN. That is, a column address includes a repair monitoring fuse address. Therefore, the signal XCOMP<10> indicates the comparison between a column address and the sate of a repair monitoring fuse, where the repairs monitoring fuse has a ruptured state.

Referring to FIGS. 2, 4 and 5B, since (TANTI_1BIT, TPMEN)=(1, 1), the value of a node N1 of the parallel column fuse monitoring unit 400 becomes 1. Therefore, an output signal YF_SUMb of the parallel column fuse monitoring unit 400 is determined by the output signal YCOMP_SUMb of the column summing block 420. At this point, since the value of the node N0 of the parallel row fuse monitoring unit 300 becomes '0', an output signal XF_SUMb of the parallel row fuse monitoring unit 300 becomes '1' regardless of the output signal of the row summing block 320. That is, the output XF_SUMb of the parallel row fuse monitoring unit 300 (except the output YF_SUMb of the parallel column fuse monitoring unit 400), the outputs XF_MOUT0 to XF_MOUT5 of the serial row fuse monitoring unit 110 to 160, and the outputs YF_MOUT0 to YF_MOUT2 of the serial column fuse monitoring units 210 to 230 all have an initial value of '1'.

First, when a column fuse state signal ANTI_Yb<2:10> and a column address LAA<2:10> input into the comparing block 410 of the parallel column fuse monitoring unit 400 are identical to each other, all the bits of an output signal YCOMP<2:10> become '1'. Since all the bits of the output signal YCOMP<2:10> of the comparing block 410, which is applied to the column summing block 420, are '1', the output signal YCOMP_SUMb of the column summing block 420 become '0' and the output YF_SUMb of the parallel column fuse monitoring unit 400 becomes '0' through an inverter INV5 and a NAND gate NAND6. This indicates that the row repair address and the band repair address were normally programmed.

Second, when the column fuse state signal ANTI_Yb<2:10> and the column address LAA<2:10> input into the comparing block 410 of the parallel column fuse monitoring unit 400 are different from each other, the output signal YCOMP<2:10> is output as '1' on a bit-by-bit basis if the results of the XNOR operation of the two signals are identical to each other. On the other hand, if the results of the XNOR operation of the two signals are different from each other, the output signal YCOMP<2:10> is output as '0' on a bit-by-bit basis. For example, if the inputs are LAA<2:10>='1111 1111 0' and ANTI_Yb<2:10>='1111 0011 0", the output value is YCOMP<2:10>='1111 0011 0'. That is, YCOMP<6> and YCOMP<7> become '0' and the other bits all become '1'.

The output signal YCOMP_SUMb generated by the column summing block 420 is output as '0' only when the corresponding input signals are all '1'. Therefore, in the above example, the output signal YCOMP_SUMb becomes '1', and the output signal YF_SUMb of the parallel column fuse monitoring unit 400 becomes '1' through the inverter INV5 and the NAND gate NAND6. This indicates that that the column repair address was not normally programmed.

In the above first and second operations, since the output signal XF_SUMb of the parallel row fuse monitoring unit 300, the output signals XF_MOUT0 to XF_MOUT5 of the serial row fuse monitoring units 110 to 160, and the output signals YF_MOUT0 to YF_MOUT2 of the serial column fuse monitoring units 210 to 230 all have an initial value of '1', all the output signals of the fuse monitoring signal generator unit 20c are summed to generate a fuse monitoring signal ANTI_MONITOR that is to be transferred to the output driver unit 30. That is, the fuse monitoring signal ANTI_MONITOR in the fourth operation mode indicates whether the column repair address ANTI_Yb<2:10> was normally programmed.

Figure 6:
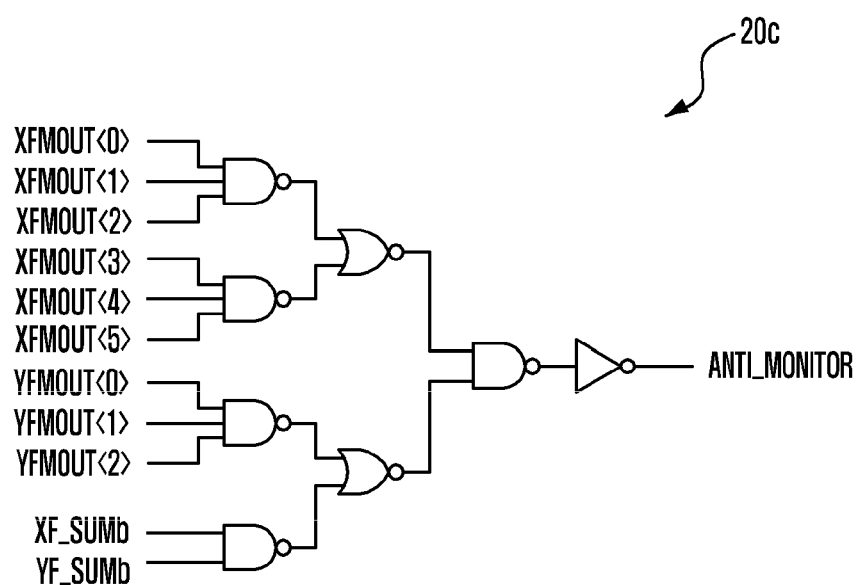
FIG. 6 is a circuit diagram of a fuse monitoring signal generator unit ANTI_MONITOR_SUM illustrated in FIG. 2, in accordance with an embodiment of the invention.

FIG. 6 is a circuit diagram of the fuse monitoring signal generator unit ANTI_MONITOR_SUM illustrated in FIG. 2, in accordance with an embodiment of the invention.

Referring to FIG. 6, the fuse monitoring signal generator unit 20c sums all the output signals XFMOUT0 to XFMOUT5, YFMOUT0 to YFMOUT2. XF_SUMb and YF_SUMb of the fuse monitoring unit 20 to generate the fuse monitoring signal ANTI_MONITOR according to the first to fourth operation modes, and transfers the generated fuse monitoring signal ANTI_MONITOR to the output driver unit 30. That is, all the output signals of the fuse monitoring unit 20 are AND-operated to generate the fuse monitoring signal ANTI_MONITOR, and the generated fuse monitoring signal ANTI_MONITOR is transferred to the output driver unit 30. Therefore, the output signal is '1' only when all the input signals are '1'.

Figure 7A:
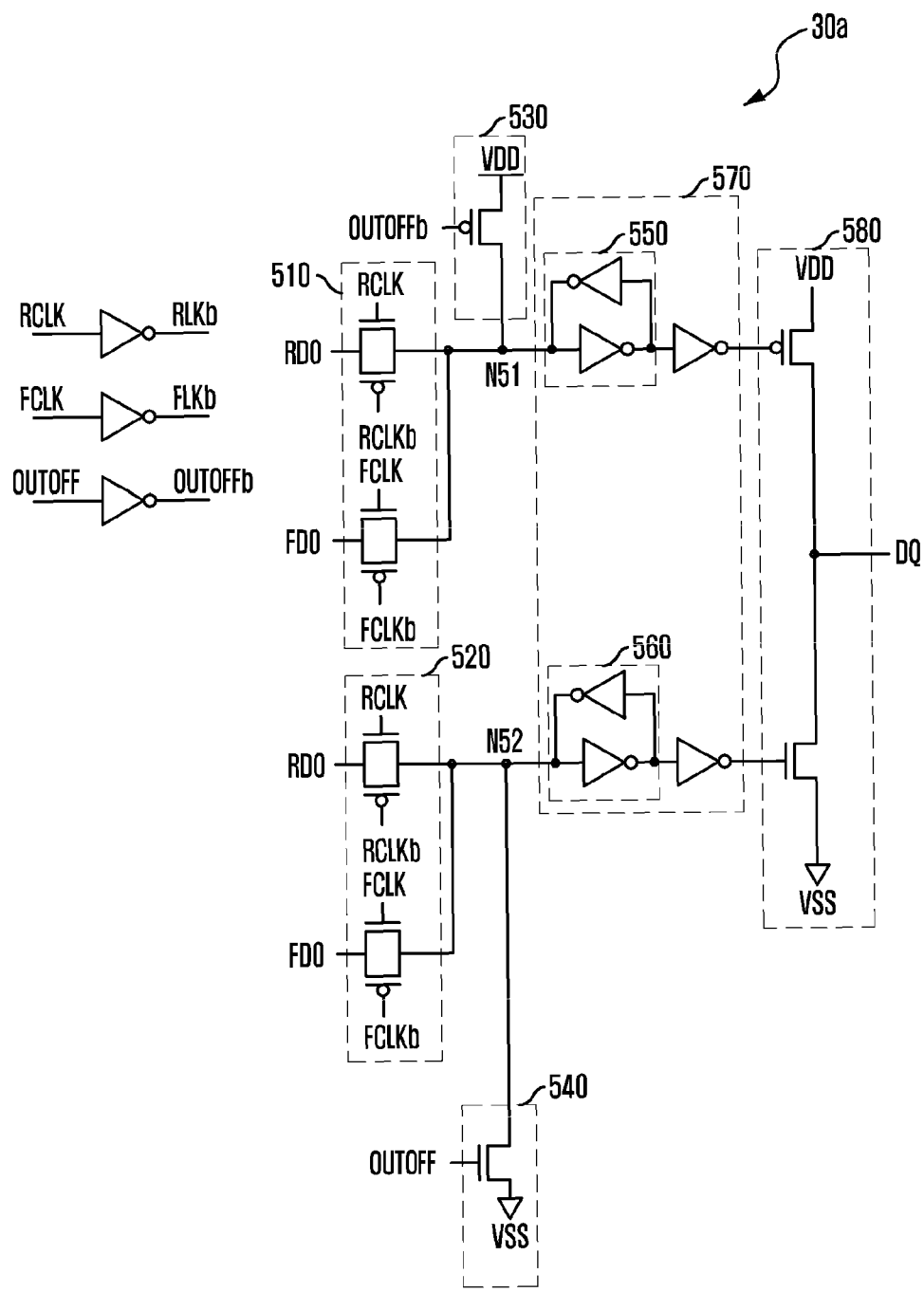
FIG. 7A is a circuit diagram of an example of a conventional output driver unit.

FIG. 7A is a circuit diagram of an example of the conventional output driver unit.

Referring to FIG. 7A, the conventional output driver unit is controlled by an output control signal OUTOFF. When the output control signal OUTOFF is '0', a normal read operation NORMAL READ is performed to output data signals RD0 and FD0 through a data output pad DQ according to clock signals RCLK and FCLK. On the other hand, if the output control signal OUTOFF is '1', the data output pad DQ maintains a high impedance (Hi-Z) state. That is, the data output pad DQ becomes an OFF state.

Figure 7B:
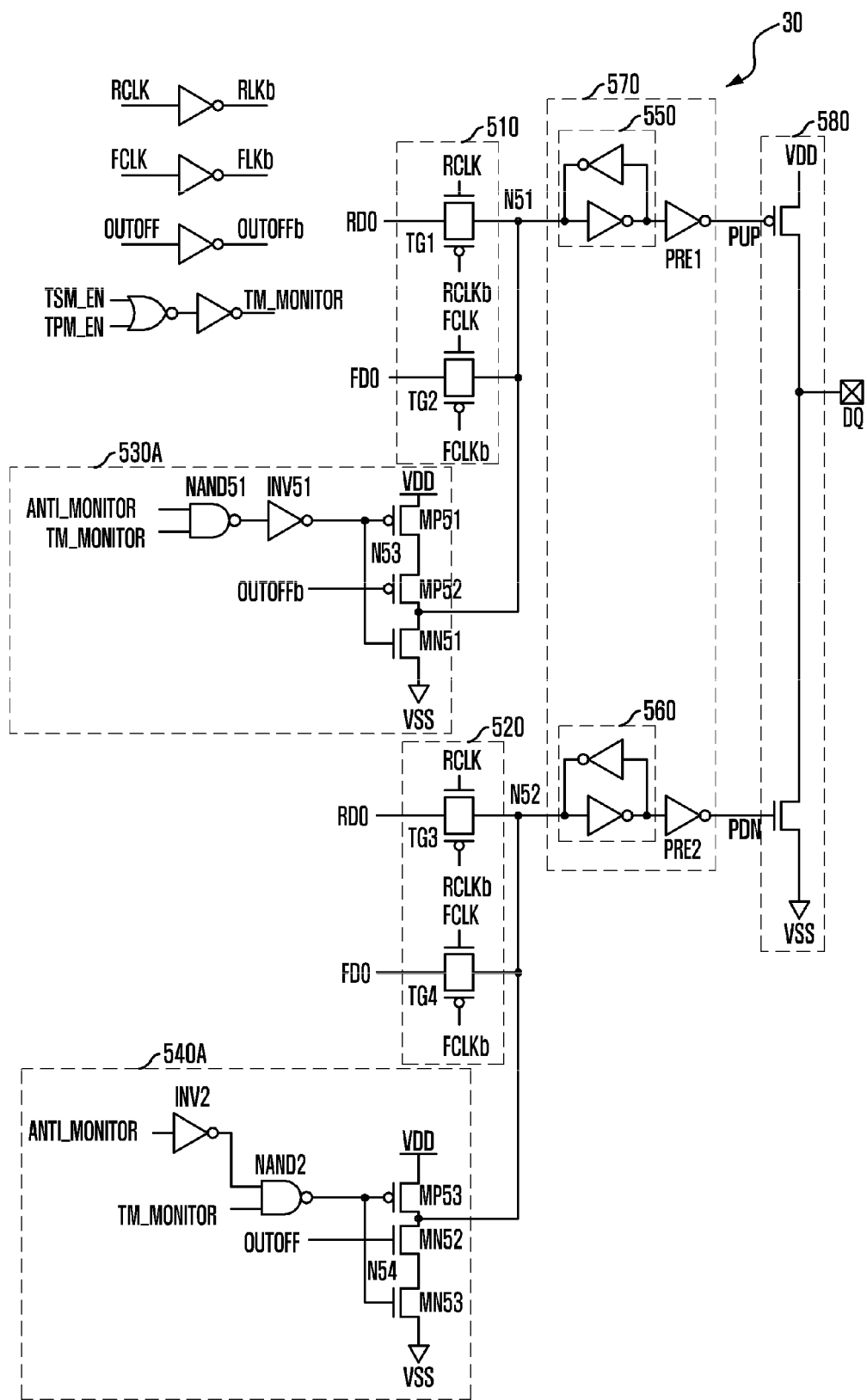
FIG. 7B is a circuit diagram of an output driver unit illustrated in FIG. 1, in accordance with an embodiment of the invention.

FIG. 7B is a circuit diagram of the output driver unit 30 illustrated in FIG. 1, in accordance with an embodiment of the invention.

The output driver unit 30 of the invention outputs the fuse monitoring signal ANTI_MONITOR to the output pad PAD. In an embodiment of the preset invention, the output driver unit 30 outputs the fuse monitoring signal ANTI_MONITOR through a data output pad DQ.

Referring to FIG. 7B, the output driver unit 30 includes data output units 510 and 520, output control units 530a and 540a, a pre-driver unit 570, and a main driver unit 580. The data output units 510 and 520 are configured to output data signals RD0 and FD0 in response to clock signals RCLK and FCLK. The output control units 530a and 540a are configured to output a fuse monitoring signal ANTI_MONITOR in response to an output control signal OUTOFF and a monitoring control signal TM_MONITOR. The pre-driver unit 570 is configured to generate a pull-down driving signal PDN and a pull-up driving signal PUP corresponding to the output signal of the output control unit or the output signal of the data output unit. The main driver unit 580 is configured to drive the data output pad DQ in response to the pull-up driving signal PUP and the pull-down driving signal PDN.

Herein, the data output unit 510 includes a first transmission gate TG1 and a second transmission gate TG2. The first transmission gate TG1 is configured to output the output data signal RD0 to a first output node N1 in response to rising clock signals RCLK and RCLKb. The second transmission gate TG2 is configured to output the output data signal FD0 to the first output node N51 in response to falling clock signals FCLK and FCLKb. The data output unit 520 includes a third transmission gate TG3 and a fourth transmission gate TG4. The third transmission gate TG3 is configured to output the output data signal RD0 to a second output node N52 in response to the rising clock signals RCLK and RCLKb. The fourth transmission gate TG4 is configured to output the output data signal FD0 to the second output node N52 in response to the falling clock signals FCLK and FCLKb.

The output control unit 530a includes a first PMOS transistor MP51, a second PMOS transistor MP52, and a first NMOS transistor MN51. The first PMOS transistor MP51 has a source connected to a supply voltage VDD, a drain connected to a first node N53, and a gate to which a fuse monitoring signal ANTI_MONITOR is input via NAND gate NAND51 and inverter INV51, where monitoring control signal TM_MONITOR is also input to NAND gate NAND51. The second PMOS transistor MP52 has a source connected to the first node N53, a drain connected to the first output node N51, and a gate to which an output control signal OUTOFFb is input. The first NMOS transistor MN51 has a source connected to a ground voltage VSS, a drain connected to the first output node N51, and a gate to which the fuse monitoring signal ANTI_MONITOR is input. The output control unit 540a includes a third PMOS transistor MP53, a second NMOS transistor MN52, and a third NMOS transistor MN53. The third PMOS transistor MP53 has a source connected to the supply voltage VDD, a drain connected to the second output node N2, and a gate to which the fuse monitoring signal ANTI_MONITOR is input. The second NMOS transistor MN2 has a source connected to a second node N4, a drain connected to the second output node N52, and a gate to which an output control signal OUTOFF is input. The third NMOS transistor MN53 has a source connected to the ground voltage VSS, a drain connected to the second node N54, and a gate to which the fuse monitoring signal ANTI_MONITOR is input via inverter INV52 and NAND gate NAND52, where monitoring control signal TM_MONITOR is also input to NAND gate NAND52.

The pre-driver unit 570 includes a first latching unit 550, a second latching unit 560, a first pre-driver PRE1, and a second pre-driver PRE2. The first latching unit 550 is configured to latch a signal of the first output node N51. The second latching unit 560 is configured to latch a signal of the second output node N52. The first pre-driver PRE1 is configured to invert a signal of the first latching unit 550 to generate a pull-up driving signal PUP. The second pre-driver PRE2 is configured to invert a signal of the second latching unit 560 to generate a pull-down driving signal PDN.

The output driver unit 30 of FIG. 7B is configured to output the fuse monitoring signal ANTI_MONITOR to the data output pad DQ while maintaining the function of the conventional output driver unit. Herein, the monitoring control signal TM_MONITOR is generated by OR-operating a serial monitoring test mode signal TSM_EN and a parallel monitoring test mode signal TPM_EN. The operation of the output driver unit 30 is performed as follows.

First, when the output control signal OUTOFF and the monitoring control signal TM_MONITOR are all '0', the serial monitoring mode or the parallel monitoring mode is not enabled and the output driver unit 30 performs the same operation as the conventional output driver unit. That is, the values of the output nodes N51 and N52 are determined by the output data signals RD0 and FD0, and the determined values are output from the main driver unit 580 through the pre-driver unit 570 to the data output pad DQ.

Second, when the output control signal OUTOFF is '1' and the monitoring control signal TM_MONITOR is '0', the first output node N51 becomes '1' and the second output node N52 becomes '0'. At this point, the data output pad DQ becomes a high impedance (Hi-Z) state and thus becomes an OFF state.

Third, when the output control signal and the monitoring control signal TM_MONITOR OUTOFF are all '1', the fuse monitoring signal ANTI_MONITOR determines the values of the output nodes N51 and N52 and the determined values are output through the data output pad DQ. That is, if the fuse monitoring signal ANTI_MONITOR is '0', the data output pad DQ also becomes '0'; and if the fuse monitoring signal ANTI_MONITOR is '1', the data output pad DQ also becomes '1'.

As described above, the invention makes it possible to monitor the state of a fuse of a redundancy circuit from the outside of a semiconductor memory device without removing a package of the semiconductor memory device. Therefore, the test can be easily performed without damaging the product value, thus reducing the test costs. Also, the invention makes it possible to test whether a repair address was accurately programmed to the corresponding fuse and to monitor the connection state of each fuse from the outside of the semiconductor memory device. Therefore, the test can be performed more clearly, thus enabling an accurate analysis of the device state.

While the invention has been described with respect to the specific embodiments, it will be apparent to those skilled in the art that various changes and modifications may be made without departing from the spirit and scope of the invention as defined in the following claims.

For example, in the above embodiment of FIG. 2, the output signals of the serial fuse monitoring unit and the output signals of the parallel fuse monitoring unit are all summed and the summing result are transferred to the output driver unit. However, in a modified embodiment, the output signals of the serial fuse monitoring unit and the output signals of the parallel fuse monitoring unit are summed in a separate manner, the two summing results are summed, and the final summing result is transferred to the output driver unit. That is, in the modified embodiment, a serial fuse monitoring signal generator unit, which is configured to generate a serial fuse monitoring signal by summing all the output signals XF_MOUT0 to XF_MOUT5 and YF_MOUT0 to YF_MOUT2 of the serial fuse monitoring unit, and a parallel fuse monitoring signal generator, which is configured to generate a parallel fuse monitoring signal by summing all the output signals XF_SUMb and YF_SUMb of the parallel fuse monitoring unit, are further provided, and the generated serial fuse monitoring signal and the generated parallel fuse monitoring signal are summed to generate the fuse monitoring signal ANTI_MONITOR. Also, the serial fuse monitoring signal and the parallel fuse monitoring signal may be monitored through the respective output pads. The output pad PAD may be implemented using only the data output pad DQ, or may be implemented using several output pads for the test operation.

Also, while the above-described embodiment has exemplified the method of repairing one defective memory cell, the invention can also be applied to a method of simultaneously repairing defective memory cells corresponding to the same row address or the same column address. Also, the invention can be applied regardless of the fuse types such as an electrical fuse and a laser fuse so that the fuse state can be monitored from the outside through the output pad. Such logical changes are too many in number of cases and can be easily derived by those skilled in the art, and thus their description will be omitted for simplicity.

What is claimed is:

1. A fuse monitoring circuit for a semiconductor device, comprising:
   a repair fuse unit including a plurality of fuses to which a repair address is programmed, and configured to output a plurality of fuse state signals corresponding to the connection states of the respective fuses in response to a fuse initialization signal;

a serial fuse monitoring unit configured to output a fuse state monitoring signal corresponding to each fuse state signal selected by an applied address in response to a serial monitoring test mode signal;

a parallel fuse monitoring unit configured to output a repair monitoring signal by comparing an applied address and the repair address in response to a parallel monitoring test mode signal; and an output unit configured to output the fuse state monitoring signal and the repair monitoring signal to an output pad in response to an output control signal.

2. The fuse monitoring circuit as recited in claim 1, wherein the serial fuse monitoring unit includes:

a plurality of serial row fuse monitoring units configured to output a plurality of row fuse state monitoring signals corresponding to each row fuse state signal and each address bit signal of an applied row address in response to a row/column selection signal; and a plurality of serial column fuse monitoring units configured to output a plurality of column fuse state monitoring signals corresponding to each column fuse state signal and each address bit signal of an applied column address in response to the row/column selection signal.

3. The fuse monitoring circuit as recited in claim 2, wherein the parallel fuse monitoring unit includes:

a parallel row fuse monitoring unit configured to output a row repair monitoring signal by comparing the applied row address and a row repair address in response to the row/column selection signal; and a parallel column fuse monitoring unit configured to output a column repair monitoring signal by comparing the applied column address and a column repair address in response to the row/column selection signal.

4. The fuse monitoring circuit as recited in claim 3, wherein the row address includes a bank address.

5. The fuse monitoring circuit as recited in claim 4, wherein the column address includes a repair monitoring fuse address.

6. The fuse monitoring circuit as recited in claim 5, further comprising a serial fuse monitoring signal generator unit configured to generate a serial fuse monitoring signal by summing a plurality of the row fuse state monitoring signals and a plurality of the column fuse state monitoring signals.

7. The fuse monitoring circuit as recited in claim 6, further comprising a parallel fuse monitoring signal generator unit configured to generate a parallel fuse monitoring signal by summing the row repair monitoring signal and the column repair monitoring signal.

8. The fuse monitoring circuit as recited in claim 7, further comprising a fuse monitoring signal generator unit configured to generate a fuse monitoring signal by summing the serial fuse monitoring signal and the parallel fuse monitoring signal.

9. The fuse monitoring circuit as recited in claim 5, further comprising a fuse monitoring signal generator unit configured to generate a fuse monitoring signal by summing a plurality of the row fuse state monitoring signals, a plurality of the column fuse state monitoring signals, the row repair monitoring signal, and the column repair monitoring signal.

10. The fuse monitoring circuit as recited in claim 8, wherein the output unit includes:

a data output unit configured to output an output data signal in response to a clock signal;

an output control unit configured to output the fuse monitoring signal in response to the output control signal and a monitoring control signal;

a pre-driver unit configured to generate a pull-down driving signal and a pull-up driving signal corresponding to an output signal of the output control unit or an output signal of the data output unit; and a main driver unit configured to drive a data output pad in response to the pull-up driving signal and the pull-down driving signal.

11. The fuse monitoring circuit as recited in claim 9, wherein the output unit includes:

a data output unit configured to output an output data signal in response to a clock signal;

an output control unit configured to output the fuse monitoring signal in response to the output control signal and a monitoring control signal;

a pre-driver unit configured to generate a pull-down driving signal and a pull-up driving signal corresponding to an output signal of the output control unit or an output signal of the data output unit; and a main driver unit configured to drive a data output pad in response to the pull-up driving signal and the pull-down driving signal.

12. The fuse monitoring circuit as recited in claim 10, wherein the data output unit includes:

a first transmission gate configured to output a first output data signal to a first output node in response to a rising clock signal;

a second transmission gate configured to output a second output data signal to the first output node in response to a falling clock signal;

a third transmission gate configured to output the first output data signal to a second output node in response to the rising clock signal; and a fourth transmission gate configured to output the second output data signal to the second output node in response to the falling clock signal.

13. The fuse monitoring circuit as recited in claim 11, wherein the data output unit includes:

a first transmission gate configured to output a first output data signal to a first output node in response to a rising clock signal;

a second transmission gate configured to output a second output data signal to the first output node in response to a falling clock signal;

a third transmission gate configured to output the first output data signal to a second output node in response to the rising clock signal; and a fourth transmission gate configured to output the second output data signal to the second output node in response to the falling clock signal.

14. The fuse monitoring circuit as recited in claim 10, wherein the output control unit includes:

a first PMOS transistor having a source connected to a supply voltage, a drain connected to a first node, and a gate to which the fuse monitoring signal is input;

a second PMOS transistor having a source connected to the first node, a drain connected to the first output node, and a gate to which the output control signal is input;

a first NMOS transistor having a source connected to a ground voltage, a drain connected to the first output node, and a gate to which the fuse monitoring signal is input;

a third PMOS transistor having a source connected to the supply voltage, a drain connected to the second output node, and a gate to which the fuse monitoring signal is input;

a second NMOS transistor having a source connected to a second node, a drain connected to the second output node, and a gate to which the output control signal is input; and a third NMOS transistor having a source connected to the ground voltage, a drain connected to the second node, and a gate to which the fuse monitoring signal is input.

15. The fuse monitoring circuit as recited in claim 11, wherein the output control unit includes:

a first PMOS transistor having a source connected to a supply voltage, a drain connected to a first node, and a gate to which the fuse monitoring signal is input;

a second PMOS transistor having a source connected to the first node, a drain connected to the first output node, and a gate to which the output control signal is input;

a first NMOS transistor having a source connected to a ground voltage, a drain connected to the first output node, and a gate to which the fuse monitoring signal is input;

a third PMOS transistor having a source connected to the supply voltage, a drain connected to the second output node, and a gate to which the fuse monitoring signal is input;

a second NMOS transistor having a source connected to a second node, a drain connected to the second output node, and a gate to which the output control signal is input; and a third NMOS transistor having a source connected to the ground voltage, a drain connected to the second node, and a gate to which the fuse monitoring signal is input.

16. The fuse monitoring circuit as recited in claim 13, wherein the pre-driver unit includes:

a first latching unit configured to latch a signal of the first output node;

a second latching unit configured to latch a signal of the second output node;

a first pre-driver configured to invert a signal of the first latching unit to generate the pull-up driving signal; and a second pre-driver configured to invert a signal of the second latching unit to generate the pull-down driving signal.

17. The fuse monitoring circuit as recited in claim 14, wherein the pre-driver unit includes:

a first latching unit configured to latch a signal of the first output node;

a second latching unit configured to latch a signal of the second output node;

a first pre-driver configured to invert a signal of the first latching unit to generate the pull-up driving signal; and a second pre-driver configured to invert a signal of the second latching unit to generate the pull-down driving signal.

* * * * *